(12) United States Patent
Mamdouh et al.

(10) Patent No.: US 12,674,823 B2
(45) Date of Patent: Jul. 7, 2026

(54) PASSIVE OPTICAL SAGNAC INTERFEROMETER FOR CURRENT SENSING

(71) Applicant: SMART DIGITAL OPTICS PTY LTD, Eveleigh (AU)

(72) Inventors: Matar Mamdouh, Eveleigh (AU); Andrew Mark Michie, Eveleigh (AU); John Ingram, Eveleigh (AU); Jose Miguel Lazaro Urrutia, Eveleigh (AU); Andoni Gallastegi Uriarte, Eveleigh (AU)

(73) Assignee: SMART DIGITAL OPTICS PTY LTD, Eveleigh (AU)

( * ) Notice: Subject to any disclaimer, the term of this patent is extended or adjusted under 35 U.S.C. 154(b) by 190 days.

(21) Appl. No.: 18/687,888

(22) PCT Filed: Sep. 2, 2022

(86) PCT No.: PCT/AU2022/051078
§ 371 (c)(1),
(2) Date: Feb. 29, 2024

(87) PCT Pub. No.: WO2023/028665
PCT Pub. Date: Mar. 9, 2023

(65) Prior Publication Data
US 2025/0012831 A1 Jan. 9, 2025

(30) Foreign Application Priority Data

Sep. 3, 2021 (AU) ................................. 2021902860
Oct. 27, 2021 (AU) ................................. 2021903435

(51) Int. Cl.
*G02B 6/293* (2006.01)
*G01R 15/24* (2006.01)
*G01R 19/00* (2006.01)

(52) U.S. Cl.
CPC ......... *G01R 15/24* (2013.01); *G01R 19/0092* (2013.01)

(58) Field of Classification Search
CPC .. G01R 15/24; G01R 15/246; G01R 19/0092; G02B 6/29302; G02B 6/29347; G02B 6/024
See application file for complete search history.

(56) References Cited

U.S. PATENT DOCUMENTS 5,677,622 A     10/1997  Clarke
9,310,399 B2 *   4/2016  Bohnert ............... G01R 15/246
(Continued)

FOREIGN PATENT DOCUMENTS

CN        204855641 U    12/2015
EP          2333498 A1    6/2011
(Continued)

*Primary Examiner* — Dominic E Hawkins
(74) *Attorney, Agent, or Firm* — Volpe Koenig

(57) ABSTRACT

Passive optical Sagnac interferometers for current sensing, method of using the same and method of constructing the same. In one embodiment, the passive optical Sagnac interferometer for current sensing comprises an N×N fibre coupler, wherein N>=3; and a fibre coil disposed on a first side of the N×N fibre coupler, a first port of the N×N fibre coupler coupled to a first end of the fibre coil via a first linear polariser and a second port of the N×N fibre coupler coupled to a second end of the fibre coil via a second linear polariser; wherein the fibre coil is configured to support only one elliptical polarisation state in counter-propagating light signals in the fibre coil.

20 Claims, 9 Drawing Sheets

(56)        References Cited

U.S. PATENT DOCUMENTS

| | | | | |
|---|---|---|---|---|
| 10,197,603 | B2 * | 2/2019 | Wallace | G01R 15/247 |
| 2007/0052971 | A1 * | 3/2007 | Bohnert | G01R 15/247 |
| | | | | 356/477 |
| 2008/0144676 | A1 * | 6/2008 | Nicholson | H01S 3/06791 |
| | | | | 372/18 |
| 2008/0310791 | A1 * | 12/2008 | Huang | G01R 15/246 |
| | | | | 385/27 |
| 2009/0002712 | A1 | 1/2009 | Huang | |
| 2011/0051145 | A1 * | 3/2011 | Haywood | G01R 15/245 |
| | | | | 356/477 |
| 2013/0195395 | A1 * | 8/2013 | Huang | G01R 15/246 |
| | | | | 385/11 |
| 2023/0050230 | A1 * | 2/2023 | Wang | G02B 6/2843 |

FOREIGN PATENT DOCUMENTS

| | | | |
|---|---|---|---|
| WO | 03/002932 | A1 | 1/2003 |
| WO | 2009/103126 | A1 | 8/2009 |
| WO | 2016/026861 | A1 | 2/2016 |

* cited by examiner

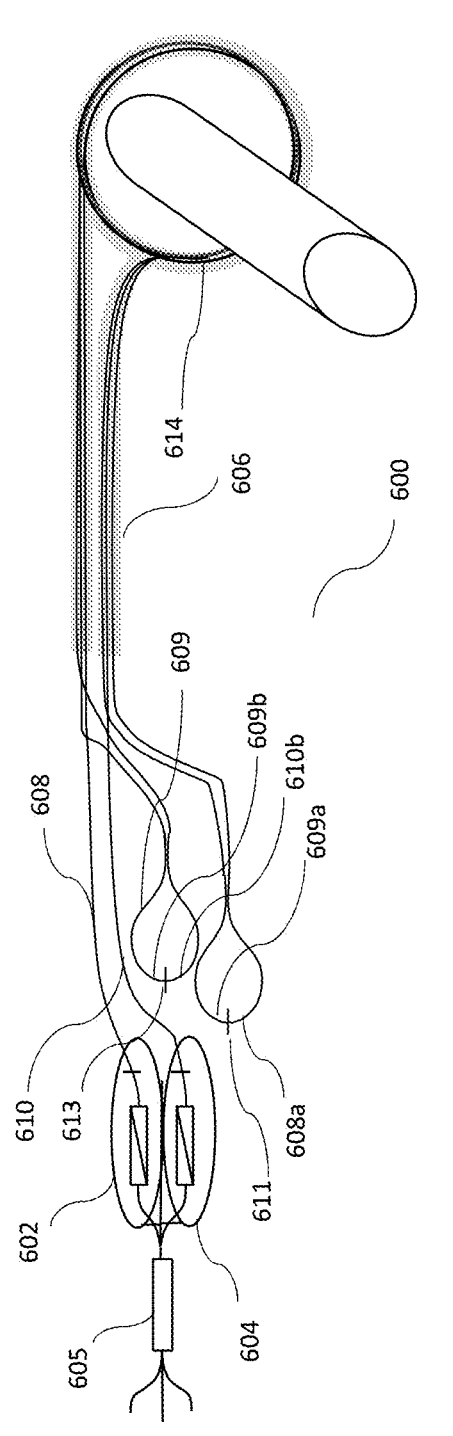
Figure 6A
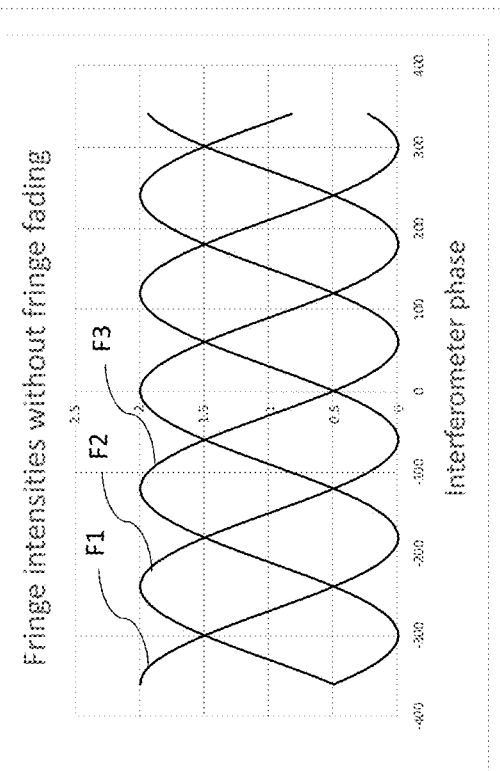
Figure 6C
Figure 6B 1408    1404    1402    1400    1420    1422

1406    1411-1413

PASSIVE OPTICAL SAGNAC INTERFEROMETER FOR CURRENT SENSING

FIELD OF INVENTION

The present invention relates broadly to passive optical Sagnac interferometer for current sensing.

BACKGROUND

Any mention and/or discussion of prior art throughout the specification should not be considered, in any way, as an admission that this prior art is well known or forms part of common general knowledge in the field.

Many variants of optical fibre based current sensors have been presented and developed by numerous research teams around the world. The great majority of those sensors are based on optical fibre gyroscope technology featuring active components to maximise interferometric phase sensitivity to current. The Faraday effect is invariably used where a non-reciprocal phase shift is induced in an optical fibre that is coiled around the conductor. The phase shift is equal and opposite for light travelling in opposite directions around the coil.

U.S. Pat. No. 5,677,622 describes a passive optical current sensor using a Sagnac interferometer with a simple 2×2 optical beam splitter for counter-propagating respective light beams, each with two elliptical polarization modes, in a spun, single mode birefringent optical fibre coil to detect current via the Faraday effect. The Sagnac interferometer is an ideal choice as it will generally only produce non-reciprocal phase shifts due to either the Faraday effect or Gyroscopic rotation. In general, slow environmental changes can be considered as "common mode" and are equal for both directions, such as ambient temperature induced effects.

However, passive Sagnac interferometry using a simple 2×2 optical beam splitter results in an interferometer with zero static phase bias. In practice this results in all the light coming back out the input port and zero intensity is coming back at the second port at the input side of the 2×2 optical beam splitter (at zero current), i.e. both the input port and the second port at the input side of the 2×2 optical beam splitter are at low sensitivity points. This property has given rise to the name "Loop Mirror" due to all the light coming back out via the input port.

Using a 3×3 single mode fibre coupler/combiner has also been proposed in U.S. Pat. No. 5,677,622 for passive Sagnac interferometry. Respective light beams, each with two elliptical polarization modes, from two of the three ports at the output side of the 3×3 single mode fibre coupler/combiner counter-propagate in a spun, single mode birefringent optical fiber coil to detect current via the Faraday effect. While the light input port for the 3×3 single mode fibre coupler/combiner still behaves in a similar way to the Loop Mirror, the two other ports at the input side of the 3×3 single mode fibre coupler/combiner are no longer at low sensitivity stationary points (at zero current) but at the relatively high sensitivity points i.e +/−2π/3 radians.

However, achieving a passive Sagnac interferometer for current sensing which is stable in both good sensitivity to current and to produce low zero current errors remains challenging.

Embodiments of the present invention seek to address at least one of the above problems.

SUMMARY

In accordance with a first aspect of the present invention, there is provided a passive optical Sagnac interferometer for current sensing comprising:

an N×N fibre coupler, wherein N≥3; and a fibre coil disposed on a first side of the N×N fibre coupler, a first port of the N×N fibre coupler coupled to a first end of the fibre coil via a first linear polariser and a second port of the N×N fibre coupler coupled to a second end of the fibre coil via a second linear polariser;

wherein the fibre coil is configured to support only one elliptical polarisation state in counter-propagating light signals in the fibre coil.

In accordance with a second aspect of the present invention, there is provided a passive optical Sagnac interferometer for current sensing comprising:

an N×N fibre coupler;

a fibre cable coupled to the N×N fibre coupler, a first output port of the N×N fibre coupler coupled to a first end of a first fibre of the fibre cable and a second output port of the N×N fibre coupler coupled to a first end of a second fibre of the fibre cable; and first and second at least approximately circular polarisers, wherein the first circular polariser is coupled between the first port of the N×N fibre coupler and the first end of the first fibre and the second circular polariser is coupled between the second port of the N×N fibre coupler and the first end of the second fibre, and wherein respective second ends of the first fibre and the second fibre are coupled to each other;

wherein the fibre cable is configured to be wound into a coil; and wherein the first fibre comprises non-polarising spun elliptically birefringent optical fibre and the second fibre comprises unspun highly birefringent optical fibre.

In accordance with a third aspect of the present invention, there is provided a passive optical Sagnac interferometer for current sensing comprising:

an N×N polarisation maintaining fibre coupler;

a fibre cable coupled to the N×N fibre coupler, a first output port of the N×N fibre coupler coupled to a first end of a first fibre of the fibre cable and a second output port of the N×N fibre coupler coupled to a first end of a second fibre of the fibre cable; and first and second linear polarisers, wherein the first linear polariser is coupled between the first port of the N×N polarisation maintaining fibre coupler and the first end of the first fibre and the second linear polariser is coupled between the second port of the N×N polarisation maintaining fibre coupler and the first end of the second fibre, and wherein respective second ends of the first fibre and the second fibre are coupled to each other;

wherein the fibre cable is configured to be wound into a coil; and wherein the first fibre comprises spun elliptically birefringent polarising optical fibre and the second fibre comprises unspun highly birefringent optical fibre.

In accordance with a fourth aspect of the present invention, there is provided a passive optical Sagnac interferometer for current sensing comprising:

an N×N fibre coupler;

a fibre cable coupled to the N×N fibre coupler, a first output port of the N×N fibre coupler coupled to a first end of a first fibre of the fibre cable and a second output port of the N×N fibre coupler coupled to a first end of a second fibre of the fibre cable;

first and second at least approximately circular polarisers, wherein the first circular polariser is coupled between the first port of the N×N fibre coupler and the first end of the first fibre and the second circular polariser is coupled between the second port of the N×N fibre coupler and the first end of the second fibre;

a first half wave plate coupled between a second end of the first fibre and a first end of a third fibre of the fibre cable; and a second half wave plate coupled between a second end of the second fibre and a second end of the third fibre;

wherein the fibre cable is configured to be wound into a coil; and wherein each of the first, second and third fibres comprises non-polarising spun elliptically birefringent optical fibre.

In accordance with a fifth aspect of the present invention, there is provided a method of sensing current in a conductor using the interferometer of any one of the first to fourth aspects.

In accordance with a sixth aspect of the present invention, there is provided a method of fabricating the interferometer of any one of the first to fourth aspects.

BRIEF DESCRIPTION OF THE DRAWINGS

Embodiments of the invention will be better understood and readily apparent to one of ordinary skill in the art from the following written description, by way of example only, and in conjunction with the drawings, in which:

FIGS. 5(*b*) and (*c*) are schematic drawings illustrating the loop-back configuration geometry for the interferometer of FIG. 5 (*a*).

FIG. 6 (*a*) is a schematic drawing illustrating a 3×3 Sagnac current sensor featuring two circular polarisers and using a cable containing three Spun HiBi fibres to measure the enclosed current and reject rotation, according to an example embodiment.

FIGS. 6(*b*) and (*c*) show a graphs of fringe intensities without fringe fading and with 75% fringe fading, respectively.

DETAILED DESCRIPTION

Figure 1:
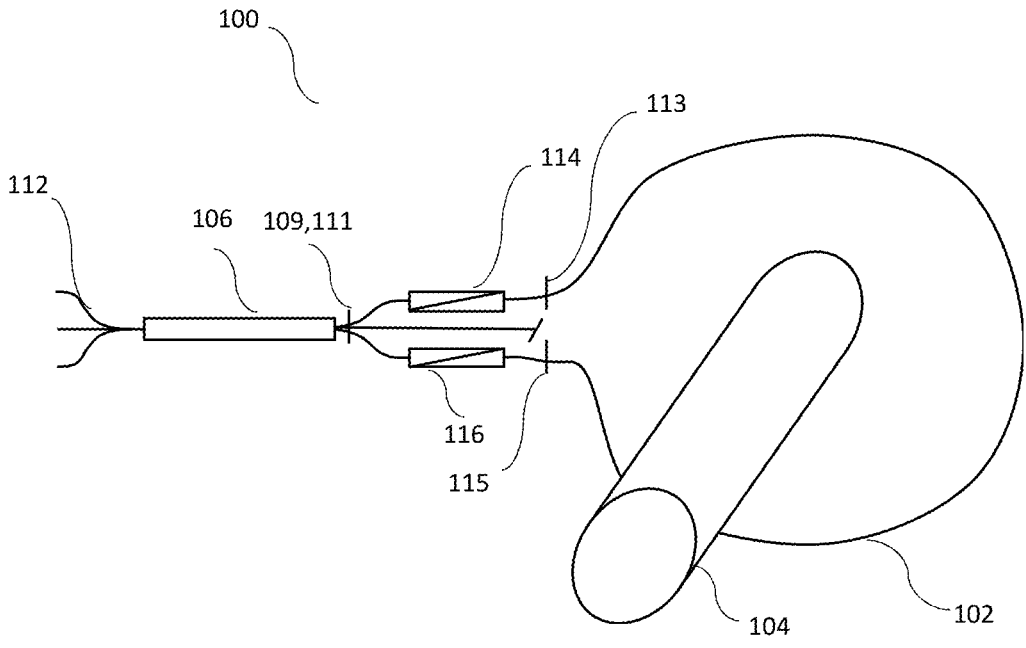
FIG. 1 is a schematic drawing illustrating a 3×3 Sagnac current sensor featuring two inline polarisers and using a coil of SPOF to measure the enclosed current, according to an example embodiment.

Example embodiments of the present invention provide a method and system for achieving and maintaining minimised fringe fading in passive optical Sagnac interferometers for current sensing, that can be used with numerous configurations. In various example embodiments, sensitivity to current is preferably maximized for circularly polarised light and minimized to zero for linearly polarised light.

Briefly, the Faraday effect is the name given to the response of the polarisation of light as it traverses through a medium that is exposed to a magnetic field aligned parallel to the propagation direction. Michael Faraday first observed the magnetic field rotates the polarisation state of light passing through the medium and concluded that light and magnetic fields are linked.

This rotation of linearly polarized light is caused by circular birefringence in the medium. Circular birefringence will both rotate a linear polarization state, or equivalently change the relative phase velocity of right and left circularly polarized states.

Circularly polarized light in ordinary telecommunications fibre will undergo a phase shift due to a magnetic field, however any birefringence (e.g. bend induced) will alter the polarisation state and if the light is periodically or randomly swapped from right hand circularly polarized light to left hand circularly polarized light the magnetic field induced phase shift will also be periodically or randomly swapped. As a result, linear birefringence in the sensing fibre quenches the Faraday-induced rotation effectively reducing the sensitivity to magnetic fields. Bend induced linear birefringence in ordinary telecommunications fibre alone will quench the sensitivity to magnetic fields. Spinning a highly birefringent fibre (HiBi fibre) preform during the fibre draw process adds circular birefringence to a structure that would otherwise have very large linear birefringence. The resulting elliptical birefringence is large relative to any packaging induced bending birefringence resulting in a fibre with a large and relatively packaging insensitive elliptical birefringence.

In one group of example embodiments, this can be achieved using a spun elliptically birefringent, and effectively polarising, optical fibre in a fibre coil enclosing a current carrying conductor or in fibre cable wound around a current carrying conductor in a loop back configuration, as will be described in more detail below with reference to specific example embodiments. Such fibre is also referred to herein as Spun Polarising Optical Fibre (SPOF). In one example, the SPOF is drawn from a HiBi fibre preform that is spun during the draw process with a prescribed ratio between spin pitch and fibre beatlength at the designed operating wavelength. Careful fibre design, and control, of the fibre parameters and fabrication conditions results in a fibre that supports two fundamental elliptical polarization eigenmodes, i.e. elliptically birefringent fibre. In addition, the fibre is designed to have a wavelength region where the slow elliptical polarization mode is transmitted and the fast mode is lossy. This creates a single polarization operation region that can be described as the single polarization window, for realizing SPOF. The two modes are typically described as the transmitted and lossy modes respectively. SPOF that possesses a differential loss of typically just 1 dB per metre results in 30 dB extinction over 30 metres of fibre. For comparison, the best bulk optic polarisers currently made using birefringent crystals typically provide 20-30 dB extinction ratios. Unlike bulk optic crystal polarisers, SPOF is a distributed polarizer. The SPOF is in a sense continuously polarizing the light as it traverses through the SPOF, as will be described in more detail below.

In this group of example embodiments, broad band depolarised light can be launched into the fibre coil and as the light travels along the coil, the SPOF ensures only one elliptical, preferably at least approximately circular, polarization state emerges at the other end of the coil. This polarising effect is reciprocal and as a result the SPOF effectively only supports one polarization state in each direction with the same handedness, i.e. for both counter-propagating beams the polarization state would be right-handed elliptical/circular or for both counter-propagating beams the polarization state would be left-handed elliptical/circular.

In another group of example embodiments, only one elliptical, preferably at least approximately circular, polarization state is excited into a non-polarising spun elliptically birefringent optical fibre (herein also referred to as Spun HiBi fibre). Including equivalent, approximately circular polarisers, at the input and output ends of the sensing coil ensures that polarised light with same handedness is excited in each direction. With reference to the description of SPOF above, Spun HiBi fibre is drawn from a HiBi fibre preform that is spun during the draw process with a prescribed ratio between spin pitch and fibre beatlength at the designed operating wavelength. Again, careful fibre design, and control, of the fibre parameters and fabrication conditions results in a fibre that supports two fundamental elliptical polarization eigenmodes, i.e. elliptically birefringent fibre. However, in contrast to SPOF, Spun HiBi fibre is designed to operate in a region where both elliptical modes are guided, as will be described in more detail below.

In this group of example embodiment, the approximately circular polariser can be achieved by combining a linear polariser with quarter wave plate. In fibre, this can be done by combining/splicing a linear polariser with a short section of unspun highly birefringent optical fibre (herein also referred to as Unspun HiBi fibre) (length ¼ beatlength), with careful alignment of the polarization maintaining axes, e.g. polarisation axes aligned at 45 degrees in a preferred embodiment.

In another group of example embodiments, the 3×3 beam coupler is also constructed using polarisation maintaining (PM) fibre, specifically Unspun HiBi fibre and the axes of the Unspun HiBi fibres of the 3×3 beam coupler are aligned with the axes of the Unspun HiBi fibre pigtails of a linear polarizer to preferably achieve optimum and stable fringe contrast. This can ensure that fringe fading is minimized without stringent packing requirements and consequently can ensure maximum signal to noise performance and minimum static phase error for preferably achieving a minimized DC value calculation error. It is noted that AC current measurement accuracy would also remain very high and potentially improved when using the PM 3×3 beam coupler, as will be described in more detail below.

In another group of example embodiments, a specific loop back configuration is used in which one section of a fibre cable has sensitivity to current, and another section that has zero sensitivity to current, while travelling in both directions through the cable. Accordingly, excellent rejection of gyroscope effect can be provided, as will be described in more detail below.

In another group of example embodiments, a specific loop back configuration is provided that can triple the sensitivity to current by swapping the handedness of the elliptical (preferably circular) polarization mode in a current sensing cable with three non-polarising spun elliptically birefringent optical fibres. This can be achieved by using two half wave plates at splices between respective pairs of the Spun HiBi fibres at one end of the current sensing cable in the loop back configuration, as will be described in more detail below.

It is noted that the above groups of example embodiments are not mutually exclusive, and can instead be combined into various example embodiments with the features of one or more of the above-described groups of example embodiments, respectively.

In the following, several individual example embodiments will be described in detail, by way of example, not limitation.

FIG. 1 shows a schematic drawing illustrating a 3×3 Sagnac current sensor 100 according to an example embodiment, comprising a coil 102 of SPOF to measure the current in the enclosed conductor 104. The coil 102 comprises one or more loops formed around the conductor 104. Broad band depolarised light can be launched via one of the single mode low birefringence input pigtails e.g. 112 of the 3×3 single mode fibre coupler 106 and hence into the coil 102 of SPOF. Two single mode low birefringence output pigtails of the 3×3 single mode fibre coupler 106 are spliced (indicated at numerals 109, 111) to Unspun HiBi pigtails of respective linear polarizers 114, 116. The other Unspun HiBi pigtails of the linear polarizers 114, 116 are spliced (indicated at numerals 113, 115) to respective ends of the coil 102 of SPOF. In all splices, the polarization maintaining axes at the respective end-faces are preferably aligned. In practice, as the ellipticity approaches circular then the alignment becomes less critical.

As the light travels along the SPOF, the SPOF ensures only one elliptical polarization state emerges at the other end of the oil 102. This polarising effect is reciprocal and as a result the coil 102 of SPOF effectively only supports one polarization state in each direction with the same handedness, i.e. for both counter-propagating beams the polarization state would be right-handed elliptical/circular or for both counter-propagating beams the polarization state would be left-handed elliptical/circular. Single polarisation of the light interfering in the 3×3 single mode fibre coupler 106 is further enhanced using the linear polarisers 114, 116, which are in the form of in-line polarizers in this example embodiment.

Figure 2:
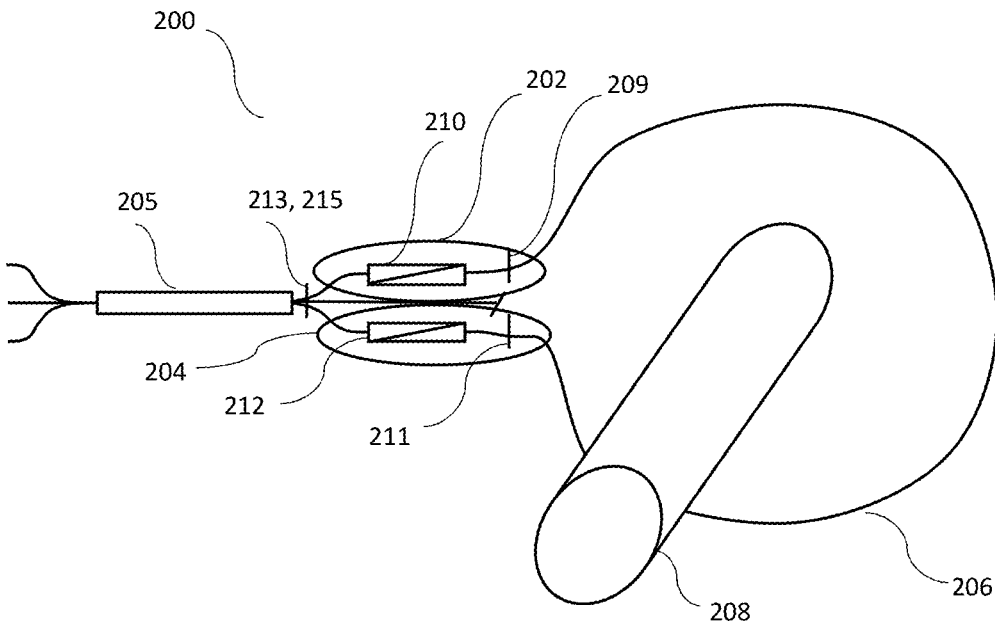
FIG. 2 is a schematic drawing illustrating a 3×3 Sagnac current sensor featuring two circular polarisers and using a coil of Spun HiBi to measure the enclosed current, according to an example embodiment.

FIG. 2 shows a schematic drawing illustrating a 3×3 Sagnac current sensor 200 according to an example embodiment, comprising a 3×3 single mode fibre coupler 205, two (at least approximately) circular polarisers 202, 204 and a coil 206 of Spun HiBi fibre to measure the current in the enclosed conductor 208. The coil 206 comprises one or more loops formed around the conductor 208.

A single circular polarization state is excited into the respective ends of the coil 206 of Spun HiBi fibre. Including equivalent, approximately circular polarisers 202, 204, at the input and output ends of the sensing coil 206 ensures that polarised light with the same handedness is excited in each direction of the sensing coil 206 of Spun HiBi fibre. The circular polarisers 202, 204 in this example embodiment comprise a combination of at least approximately linear polarisers 210, 212 and respective ¼ beatlength sections of Unspun HiBi fibre (i.e. with length ¼ beatlength). Specifically, two single mode low birefringence output pigtails of the 3×3 single mode fibre coupler 205 are spliced (indicated at numerals 213, 215) to Unspun HiBi pigtails of the linear polarizers 210, 212 respectively. The other Unspun HiBi pigtails of the linear polarizers 210, 212 are spliced, with the polarisation axes at the end-faces at 45 degrees, to the respective ¼ beatlength sections of Unspun HiBi fibre, which in turn are spliced the respective ends of the coil 206 of Spun HiBi fibre (the pairs of splices jointly indicated at numerals 209, 211). In the splices other than the splice between the Unspun HiBi pigtails of the linear polarizers 210, 212 and the ¼ beatlength sections of Unspun HiBi fibre, the polarization maintaining axes at the respective end-faces are preferably aligned. In practice, as the ellipticity approaches circular then the alignment becomes less critical.

As a result, only one polarization state is propagating in each direction, i.e. for both counter-propagating beams, which interfere in the 3×3 single mode fibre coupler 205. The linear polarisers 210, 212 are in the form of in-line polarizers in this example embodiment.

Figure 3:
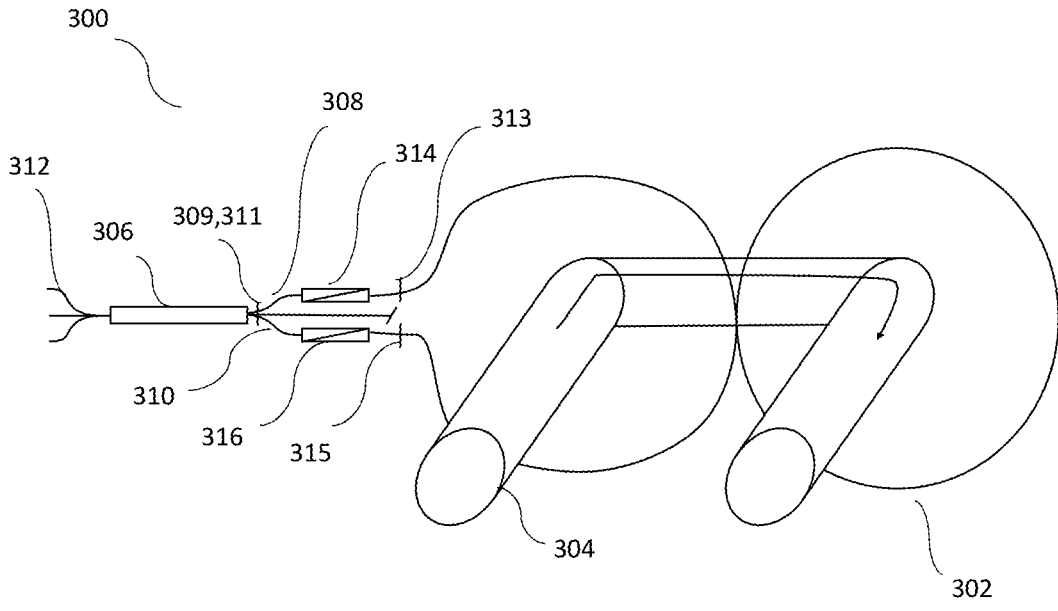
FIG. 3 is a schematic drawing illustrating a 3×3 Sagnac current sensor featuring two inline polarisers and using a coil of SPOF arranged in a figure 8 to measure the enclosed current and reject rotation, according to an example embodiment.
Figure 8:
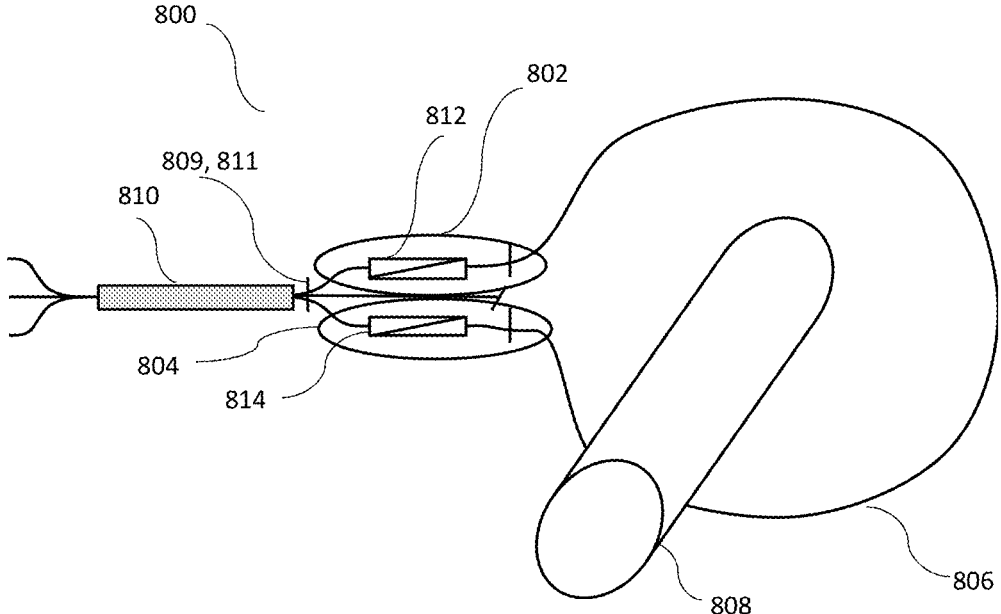
FIG. 8 is a schematic drawing illustrating a 3×3 Polarisation maintaining Sagnac current sensor featuring two circular polarisers and using a coil of Spun HiBi to measure the enclosed current, according to an example embodiment.

FIG. 3 shows a schematic drawing illustrating a 3×3 Sagnac current sensor 300 according to an example embodiment, comprising a coil 302 of SPOF arranged in a "figure 8" to measure the current in the enclosed conductor 304, while rejecting rotation that may be caused by the gyroscope effect. The coil 302 comprises one or more figure 8 loops formed around the conductor 104. Broad band depolarised light can be launched via one of the single mode low birefringence input pigtails e.g. 312 of the 3×3 single mode fibre coupler 306 and hence into the coil 302 of SPOF. Two single mode low birefringence output pigtails of the 3×3 single mode fibre coupler 306 are spliced (indicated at numerals 309, 311) to Unspun HiBi pigtails of respective linear polarizers 314, 316. The other Unspun HiBi pigtails of the linear polarizers 314, 316 are spliced (indicated at numerals 313, 315) to respective ends of the coil 302 of SPOF. In all splices, the polarization maintaining axes at the respective end-faces are preferably aligned. In practice, as the ellipticity approaches circular then the alignment becomes less critical.

As the light travels along the SPOF, the SPOF ensures only one elliptical state emerges at the other end of the coil 302. This polarising effect is reciprocal and as a result the coil 302 of SPOF effectively only supports one polarization state in each direction, with the same handedness, i.e. for both counter-propagating beams the polarization state would be right-handed elliptical/circular or for both counter-propagating beams the polarization state would be left-handed elliptical/circular. In addition, because each of the counter-propagating beams changes its direction around the conductor 304 in the FIG. 8 coil 302 of SPOF, any gyroscope effect will be substantially cancelled. Single polarisation of the light interfering in the 3×3 single mode fibre coupler 306 to is further enhanced using the linear polarisers 312, 314, which are in the form of in-line polarizers in this example embodiment.

Figure 4:
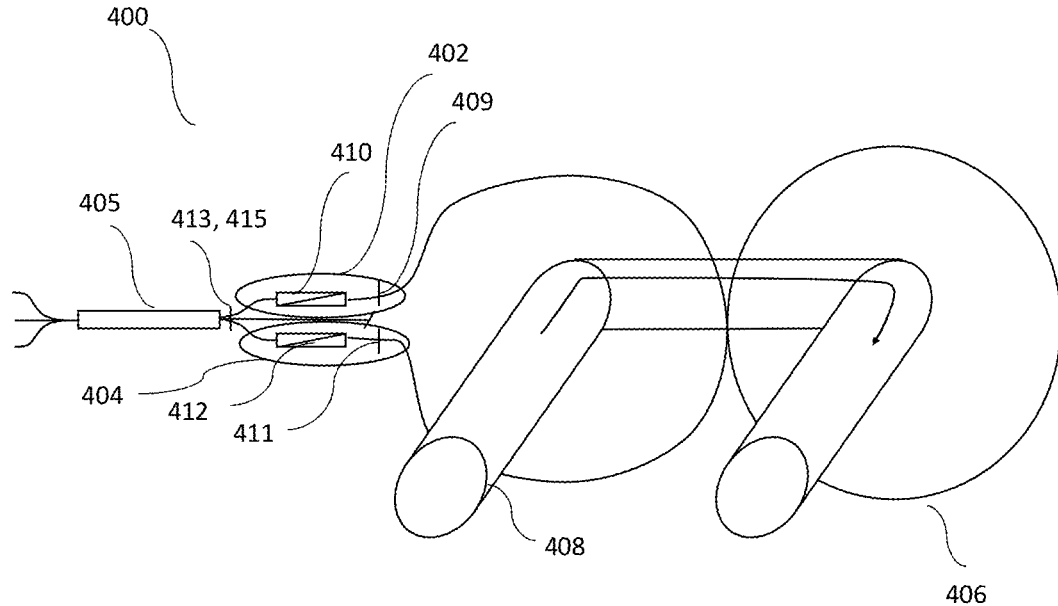
FIG. 4 is a schematic drawing illustrating a 3×3 Sagnac current sensor featuring two circular polarisers and using a coil of Spun HiBi arranged in a figure 8 to measure the enclosed current and reject rotation, according to an example embodiment.

FIG. 4 shows a schematic drawing illustrating a 3×3 Sagnac current sensor 400 according to an example embodiment, comprising a 3×3 single mode fibre coupler 405, two (at least approximately) circular polarisers 402, 404 and a coil 406 of Spun HiBi fibre arranged in a figure 8 to measure the current in the enclosed conductor 408, while rejecting rotation that may be caused by the gyroscope effect. The coil 406 comprises one or more figure 8 loops formed around the conductor 408.

A single circular polarization state is excited into the respective ends of the coil 406 of Spun HiBi fibre. Including equivalent, approximately circular polarisers 402, 404, at the input and output ends of the sensing coil 406 ensures that polarised light with the same handedness is excited in each direction of the sensing coil 406 of Spun HiBi fibre. The circular polarisers 402, 404 in this example embodiment comprise a combination of linear polarisers 410, 412 and respective ¼ beatlength sections of Unspun HiBi fibre (i.e. with length ¼ beatlength). Specifically, two single mode low birefringence output pigtails of the 3×3 single mode fibre coupler 405 are spliced (indicated at numerals 413, 415) to Unspun HiBi pigtails of the linear polarizers 410, 412 respectively. The other Unspun HiBi pigtails of the linear polarizers 410, 412 are spliced, with the polarisation axes at the end-faces at 45 degrees, to the respective ¼ beatlength sections of Unspun HiBi fibre, which in turn are spliced the respective ends of the coil 406 of Spun HiBi fibre (splices jointly indicated at numerals 409, 411). In the splices other than the splice between the Unspun HiBi pigtails of the linear polarizers 410, 412 and the ¼ beatlength sections of Unspun HiBi fibre, the polarization maintaining axes at the respective end-faces are preferably aligned. In practice, as the ellipticity approaches circular then the alignment becomes less critical.

As a result, only one polarization state is propagating in each direction, i.e. for both counter-propagating beams. In addition, because each of the counter-propagating beams changes its direction around the conductor 408 in the respective loops of the FIG. 8 coil 406 of Spun HiBi fibre, any gyroscope effect will be substantially cancelled. The linear polarisers 410, 412 are in the form of in-line polarisers in this example embodiment.

Figures 5A, 5B:
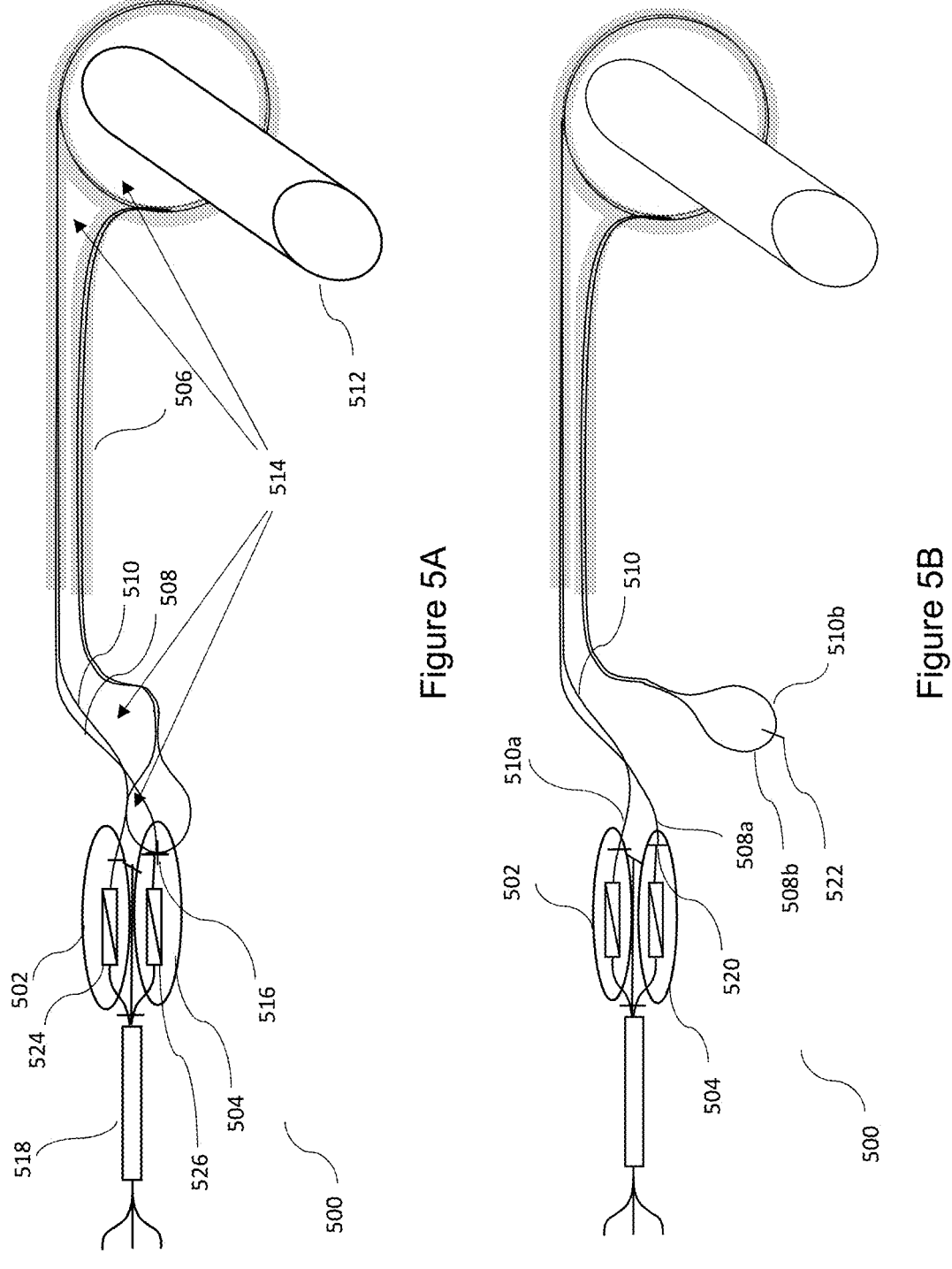
FIG. 5(*a*) is a schematic drawing illustrating a 3×3 Sagnac current sensor featuring two circular polarisers and using a cable containing one Spun HiBi fibre and one Unspun HiBi fibre to measure the enclosed current and reject rotation, according to an example embodiment.

FIG. 5A shows a schematic drawing illustrating a 3×3 Sagnac current sensor 500 according to an example embodiment, comprising two (at least approximately) circular polarisers 502, 504 and a cable 506 containing one Spun HiBi fibre 508 and one Unspun HiBi fibre 510. The cable 506 is wound in one or more loops around the conductor 512. The circular polarisers 502, 504 in this example embodiment also comprise a combination of linear polarisers 524, 526 and respective ¼ sections of Unspun HiBi fibre (i.e. with length ¼ beatlength).

In this example embodiment the Spun HiBi fibre 508 is sensitive to the current in the enclosed conductor 512 whereas the Unspun HiBi 510 is not. To effectively form a closed loop (also referred to as "loop back configuration" herein) with the cable 506 enclosing the conductor 512, two optimized splices are placed as near as possible to each other at one end of the loop, indicated at numeral 516.

With reference to FIG. 5B, the ¼ beatlength section of HiBi fibre that is part of the circular polariser 502 is spliced to one end 510a of the Unspun HiBi fibre 510, and the other end 510b of the Unspun HiBi fibre 510 is spliced (indicated at numeral 522) to one end 508b of the Spun HiBi fibre 508. The other end 508a of the Spun HiBi fibre 508 is spliced (indicated at numeral 520) to the ¼ section of HiBi fibre that is part of the circular polariser 504. Placing the splices indicated at numerals 520, 522 as close together as possible preferably ensures that the path traced out by the current sensitive Spun HiBi fibre 508 in the loop back configuration is a good approximation to a closed loop. In all splices, the polarization maintaining axes at the respective end-faces are preferably aligned. In practice, as the ellipticity approaches circular then the alignment becomes less critical.

Returning to FIG. 5A, by moving the splices 520, 522 (which are jointly indicated at numeral 516 in FIG. 5A) close to each other to form the loop back configuration, the path traced out by the current sensitive Spun HiBi fibre 508 is a good approximation to a closed loop as indicated by numerals 514.

Accordingly, light from each of two output ports of the 3×3 single mode fibre coupler 518 travels in one section of the cable 506 that has sensitivity to current, i.e. in Spun HiBi fibre 508, and in another section that has zero sensitivity to current, i.e. Unspun HiBi fibre 510, while travelling in both directions through the cable 506 in the loop back configuration. Accordingly, excellent rejection of gyroscope effect can be provided. Single polarisation of the light interfering in the 3×3 single mode fibre coupler 518 is achieved using the linear polarisers 524, 526 (part of the circular polarisers 502, 504, respectively), which are in the form of in-line polarisers in this example embodiment.

FIG. 6A shows a schematic drawing illustrating a 3×3 Sagnac current sensor 600 according to an example embodiment, comprising a 3×3 single mode fibre coupler 605, two (at least approximately) circular polarisers 602, 604 and a cable 606 containing three Spun HiBi fibres 608, 609 and 610. A half wave plate 611 is placed/spliced between the end 608a of the Spun HiBi fibre 608 and the end 609a of the Spun HiBi fibre 609, effectively swapping the handedness of the polarization mode. Similarly, another half wave plate 613 is placed/spliced between the end 609b of the Spun HiBi fibre 609 and the end 610b of the Spun HiBi fibre 610. Placing the splices for the waveplates 611, 613 and the splices between the circular polarizers 602, 604 and the Spun HiBi fibres 608, 610 as close together as possible preferably ensures that the respective paths traced out by the current sensitive Spun HiBi fibres 608, 609 and 610 are a good approximation to a closed loop. This effectively triples the sensitivity of the loop/coil 614 to current, while also offering excellent rejection of rotation. It is noted that in FIG. 6A, the splices for the waveplates 611, 613 and the splices between the circular polarizers 602, 604 and the Spun HiBi fibres 608, 610 are not shown placed close together, for better clarity of the drawing.

As will be appreciated by a person skilled in the art, in the 3×3 single mode couplers in the embodiments described above optimum interference occurs when the polarisation states of the two recombined optical beams are perfectly aligned. On the other hand, orthogonal polarisations states will not interfere and only the average intensity will be seen at the outputs. When the polarisation states begin to diverge or depart from perfect alignment, fringe fading occurs. It has been recognised by the present inventors that this can occur in the optical fibre leads of the optical beam coupler in a Sagnac current sensing interferometer. Fringe fading will not only effectively reduce signal to noise performance but it can also result in errors in the calculated phase effectively appearing as a static phase error. For illustration, FIG. 6B shows a graph of fringe intensities without fringe fading, while FIG. 6C shows a graph of fringe intensities with 75% fringe fading.

While careful packaging can reduce the fringe fading to a minimum in various example embodiments, in another group of example embodiments the 3×3 beam coupler is also constructed using polarisation maintaining (PM) fibre, specifically Unspun HiBi fibre and the axes of the Unspun HiBi fibres of the 3×3 beam coupler are aligned with the axes of the Unspun HiBi fibre pigtails of the linear polariser in the various examples to preferably achieve optimum and stable fringe contrast. This is also referred to herein as a 3×3 PM coupler. This can ensure that fringe fading is minimized without stringent packing requirements and consequently can ensure maximum signal to noise performance and minimum static phase error for preferably achieving a minimized DC value calculation error.

Figure 7:
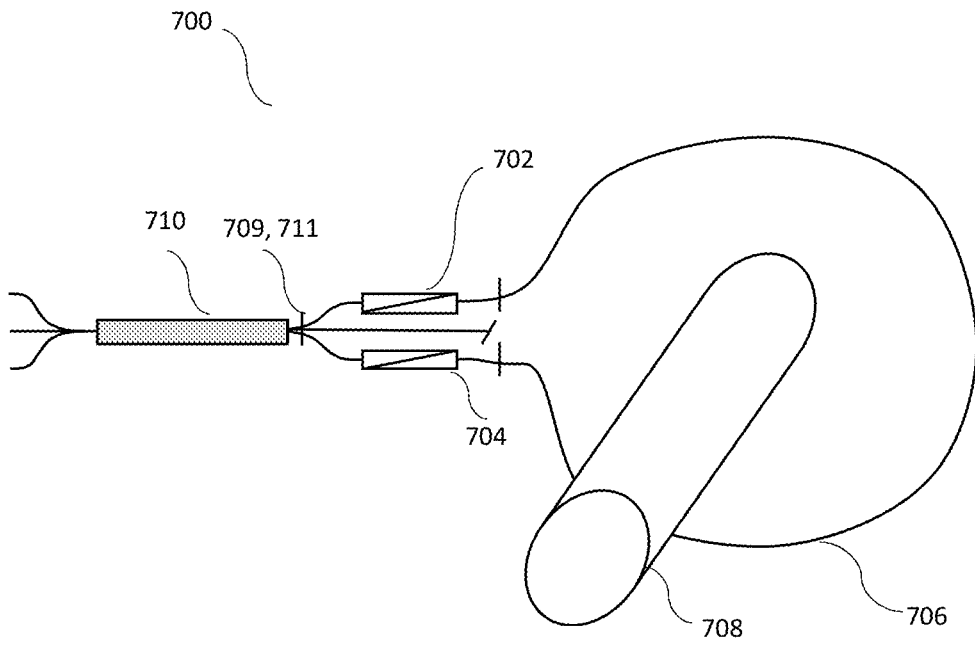
FIG. 7 is a schematic drawing illustrating a 3×3 Polarisation maintaining Sagnac current sensor featuring two inline polarisers and using a coil of SPOF to measure the enclosed current, according to an example embodiment.

FIG. 7 shows a schematic drawing illustrating a 3×3 Polarisation maintaining Sagnac current sensor 700 according to an example embodiment comprising two in-line polarisers 702, 704 and a coil 706 of SPOF to measure the current in an enclosed conductor 708. The 3×3 Polarisation maintaining Sagnac current sensor 700 is similar to the example embodiment described above with reference to FIG. 1, except that this example embodiment preferably minimizes fringe fading and offers improved stability and reduced zero current errors. More specifically, a 3×3 PM coupler 710 is constructed using polarisation Unspun HiBi fibre and the axes at the end-faces of the Unspun HiBi fibre output pigtails of the 3×3 PM coupler 710 are aligned with the axes at the end-faces of the Unspun HiBi fibre pigtails of the linear polarisers 702, 704 during the splicing, indicated at numerals 709, 711, to preferably achieve optimum and stable fringe contrast. This can ensure that fringe fading is minimized and consequently can ensure maximum signal to noise performance and minimum static phase error for preferably achieving a minimized DC value calculation error.

FIG. 8 shows a schematic drawing illustrating a 3×3 Polarisation maintaining Sagnac current sensor 800 according to an example embodiment, comprising two circular polarisers 802, 804 and a coil 806 of Spun HiBi to measure the current in an enclosed conductor 808. The 3×3 Polarisation maintaining Sagnac current sensor 800 is similar to the example embodiment described above with reference to FIG. 2, except that this example embodiment preferably minimizes fringe fading and offers improved stability and reduced zero current errors. More specifically, in an example embodiment a 3×3 PM coupler 810 is constructed using Unspun HiBi fibre and the axes at the end-faces of the Unspun HiBi fibre output pigtails of the 3×3 beam coupler 810 are aligned with the axes at the end-faces of the Unspun HiBi fibre pigtails of the linear polarisers 812, 814 (part of the circular polarisers 802, 804, respectively) during the splicing, indicated at numerals 809, 811, to preferably achieve optimum and stable fringe contrast. This can ensure that fringe fading is minimized and consequently can ensure maximum signal to noise performance and minimum static phase error for preferably achieving a minimized DC value calculation error.

Figure 9:
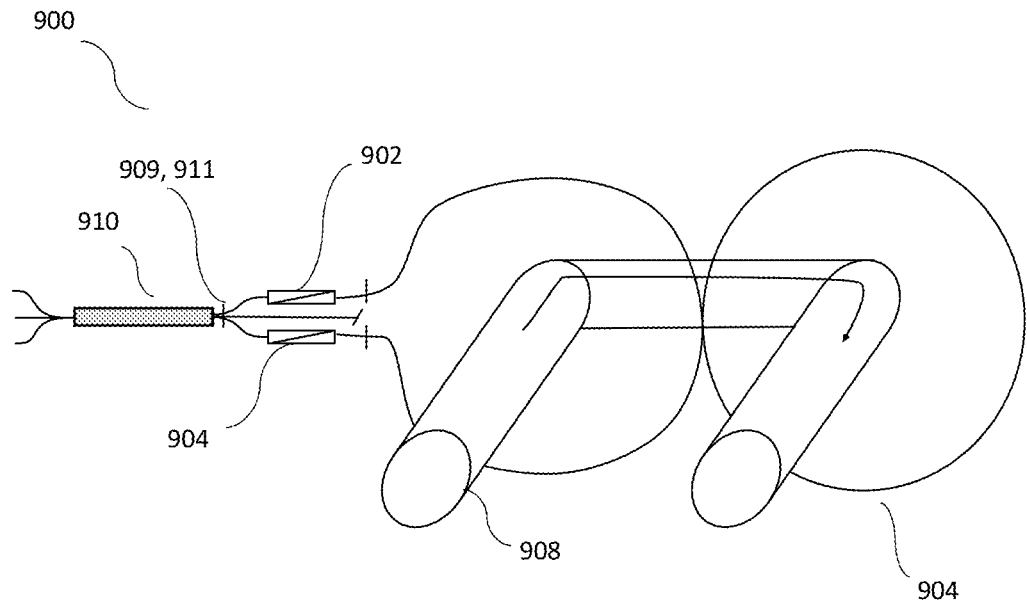
FIG. 9 is a schematic drawing illustrating a 3×3 Polarisation maintaining Sagnac current sensor featuring two inline polarisers and using a coil of SPOF arranged in a figure 8 to measure the enclosed current and reject rotation, according to an example embodiment.

FIG. 9 shows a schematic drawing illustrating a 3×3 Polarisation maintaining Sagnac current sensor 900 according to an example embodiment, comprising two inline linear polarisers 902, 904 and a coil 906 of SPOF arranged in a FIG. 8 to measure the current in enclosed conductor 908 and reject rotation. The 3×3 Polarisation maintaining Sagnac current sensor 900 is similar to the example embodiment described above with reference to FIG. 3, except that this example embodiment preferably minimizes fringe fading and offers improved stability and reduced zero current errors. More specifically, in an example embodiment a 3×3 PM coupler 910 is constructed using Unspun HiBi fibre and the axes at the end-faces of the unspun HiBi fibre output pigtails of the 3×3 beam PM coupler 910 are aligned with the axes at the end-faces of the Unspun HiBi fibre pigtails of the linear polarisers 902, 904 during the splicing, indicated at numerals 909, 911 to preferably achieve optimum and stable fringe contrast. This can ensure that fringe fading is minimized and consequently can ensure maximum signal to noise performance and minimum static phase error for preferably achieving a minimized DC value calculation error.

Figure 10:
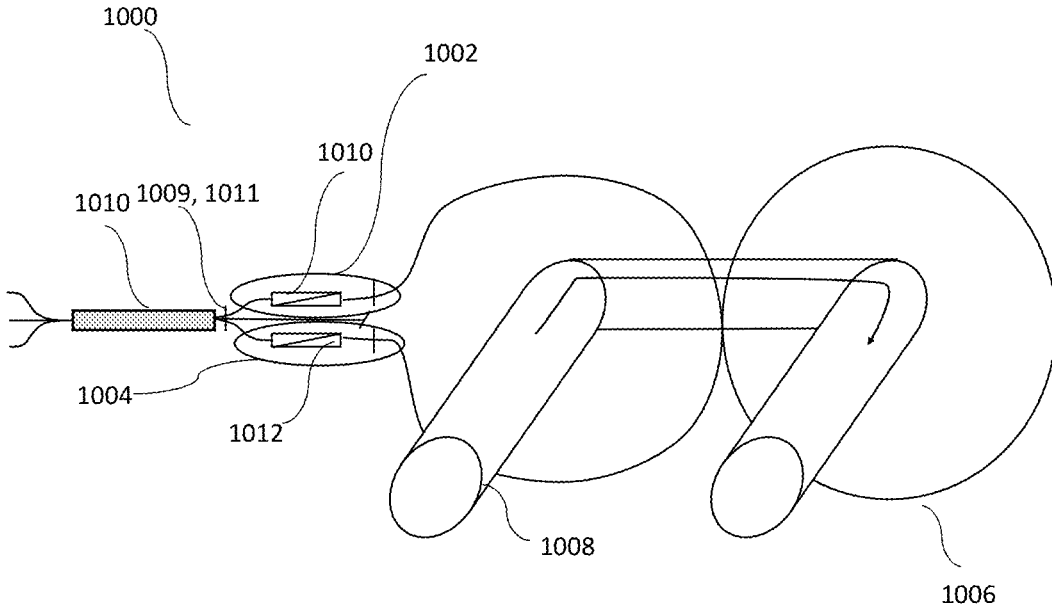
FIG. 10 is a schematic drawing illustrating a 3×3 Polarisation maintaining Sagnac current sensor featuring two circular polarisers and using a coil of Spun HiBi arranged in a figure 8 to measure the enclosed current and reject rotation, according to an example embodiment.

FIG. 10 shows a schematic drawing illustrating a 3×3 Polarisation maintaining Sagnac current sensor 1000 according to an example embodiment, comprising two (at least approximately) circular polarisers 1002, 1004 and a coil 1006 of Spun HiBi arranged in a figure 8 to measure the current in an enclosed conductor 1008 and reject rotation. The 3×3 Polarisation maintaining Sagnac current sensor 1000 is similar to the example embodiment described above with reference to FIG. 4, except that this example embodiment preferably minimizes fringe fading and offers improved stability and reduced zero current errors. More specifically, in an example embodiment a 3×3 beam PM coupler 1010 is constructed using Unspun HiBi fibre and the axes at the end-faces of the Unspun HiBi fibre output pigtails of the 3×3 PM coupler 1010 are aligned with the axes at the end-faces of the Unspun HiBi fibre pigtails of the linear polarisers 1012, 1014 (part of the circular polarisers 1002, 1004, respectively) during the splicing, indicated at numerals 1009, 1011, to preferably achieve optimum and stable fringe contrast. This can ensure that fringe fading is minimized and consequently can ensure maximum signal to noise performance and minimum static phase error for preferably achieving a minimized DC value calculation error.

Figures 11, 12:
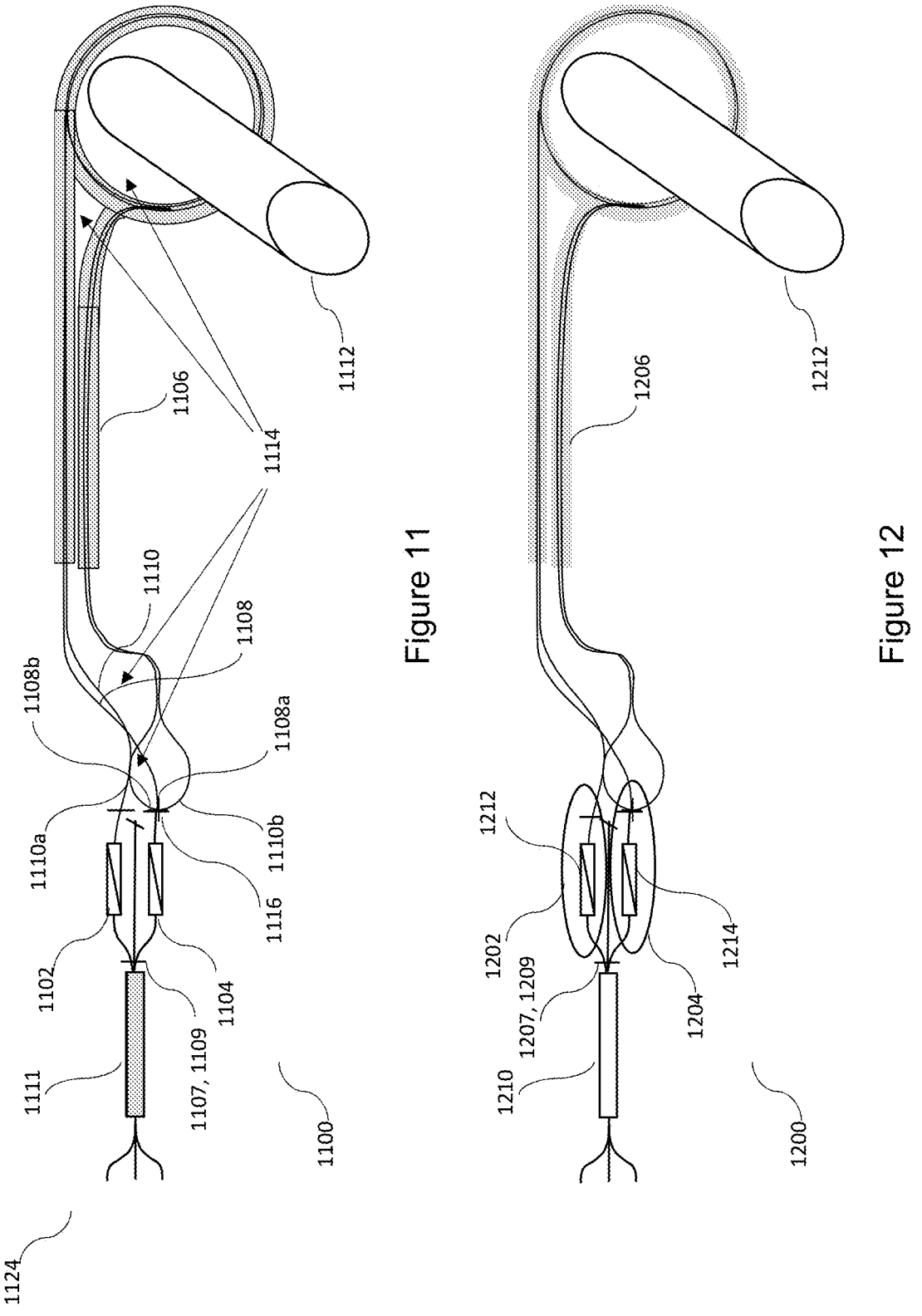
FIG. 11 is a schematic drawing illustrating a 3×3 Polarisation maintaining Sagnac current sensor featuring two inline polarisers and using a cable containing one SPOF fibre and one Unspun HiBi fibre to measure the enclosed current and reject rotation, according to an example embodiment.
FIG. 12 is a schematic drawing illustrating a 3×3 Polarisation maintaining Sagnac current sensor featuring two circular polarisers and using a cable containing one Spun HiBi fibre and one Unspun HiBi fibre to measure the enclosed current and reject rotation, according to an example embodiment.

FIG. 11 shows a schematic diagram illustrating a 3×3 Polarisation maintaining Sagnac current sensor 1100 according to an example embodiment, comprising two in-line linear polarisers 1102, 1104 and a cable 1106 containing one SPOF fibre 1108 and one Unspun HiBi fibre 1110, in a loop back configuration. The cable 1106 is wound in one or more loops around the conductor 1112. In this example embodiment the SPOF fibre 1108 is sensitive to the current in the enclosed conductor 1112 whereas the Unspun HiBi fibre 1110 is not.

This example embodiment preferably minimizes fringe fading and offers improved stability and reduced zero current errors. More specifically, in an example embodiment a 3×3 PM coupler 1111 is constructed using Unspun HiBi fibre and the axes at the end-faces of the Unspun HiBi fibre output pigtails of the 3×3 PM coupler 1111 are aligned with the axes at the end-faces of the Unspun HiBi fibre pigtails of the linear polarisers 1102, 1104 during the splicing, indicated at numerals 1107, 1109, to preferably achieve optimum and stable fringe contrast. This can ensure that fringe fading is minimized and consequently can ensure maximum signal to noise performance and minimum static phase error for preferably achieving a minimized DC value calculation error. To effectively form a closed loop (also referred to as "loop back configuration" herein) with the cable 1106 enclosing the conductor 1112, two optimized splices between one end 1108a of the SPOF fibre 1108 and the Unspun HiBi fibre pigtail of the linear polariser 1104, and between the other end 1108b of the SPOF fibre 1108 and one end 1110b of the Unspun HiBi fibre 1110 in the cable 1106 are placed as near as possible to each other at one end of the loop, indicated at numeral 1116, which preferably ensures that the path traced out by the current sensitive Spun HiBi fibre 1108 in the loop back configuration is a good approximation to a closed loop (compare also FIGS. 5A, B). In the optimized splices, the polarization maintaining axes at the end-faces are preferably aligned. In practice, as the ellipticity approaches circular then the alignment becomes less critical.

Accordingly, light from each of two output ports of the 3×3 PM coupler 1111 travels in one section of the cable 1106 that has sensitivity to current, i.e. in SPOF fibre 1108, and in another section that has zero sensitivity to current, i.e. Unspun HiBi fibre 1110, while travelling in both directions through the cable 1106 in the loop back configuration. Accordingly, excellent rejection of gyroscope effect can also be provided. Single polarisation of the light interfering in the 3×3 PM coupler 1111 is achieved using the linear polarisers 1102, 1104, which are in the form of in-line polarizers in this example embodiment.

FIG. 12 shows a schematic drawing illustrating a 3×3 Polarisation maintaining Sagnac current sensor 1200 according to an example embodiment, comprising two (at least approximately) circular polarisers 1202, 1204 and a cable 1206 containing one Spun HiBi fibre 1208 and one Unspun HiBi fibre 1210. The 3×3 Polarisation maintaining Sagnac current sensor 1200 is similar to the example embodiment described above with reference to FIGS. 5A and B, except that this example embodiment preferably minimizes fringe fading and offers improved stability and reduced zero current errors. More specifically, in an example embodiment a 3×3 beam PM coupler 1210 is constructed using HiBi fibre and the axes at the end-faces of the Unspun HiBi fibres of the 3×3 PM coupler 1210 are aligned with the axes at the end-faces of the Unspun HiBi fibre pigtails of the linear polarisers 1212, 1214 (part of the circular polarisers 1202, 1204, respectively) during the splicing, indicated at numerals 1207, 1209, to preferably achieve optimum and stable fringe contrast. This can ensure that fringe fading is minimized and consequently can ensure maximum signal to noise performance and minimum static phase error for preferably achieving a minimized DC value calculation error.

Figures 13, 14:
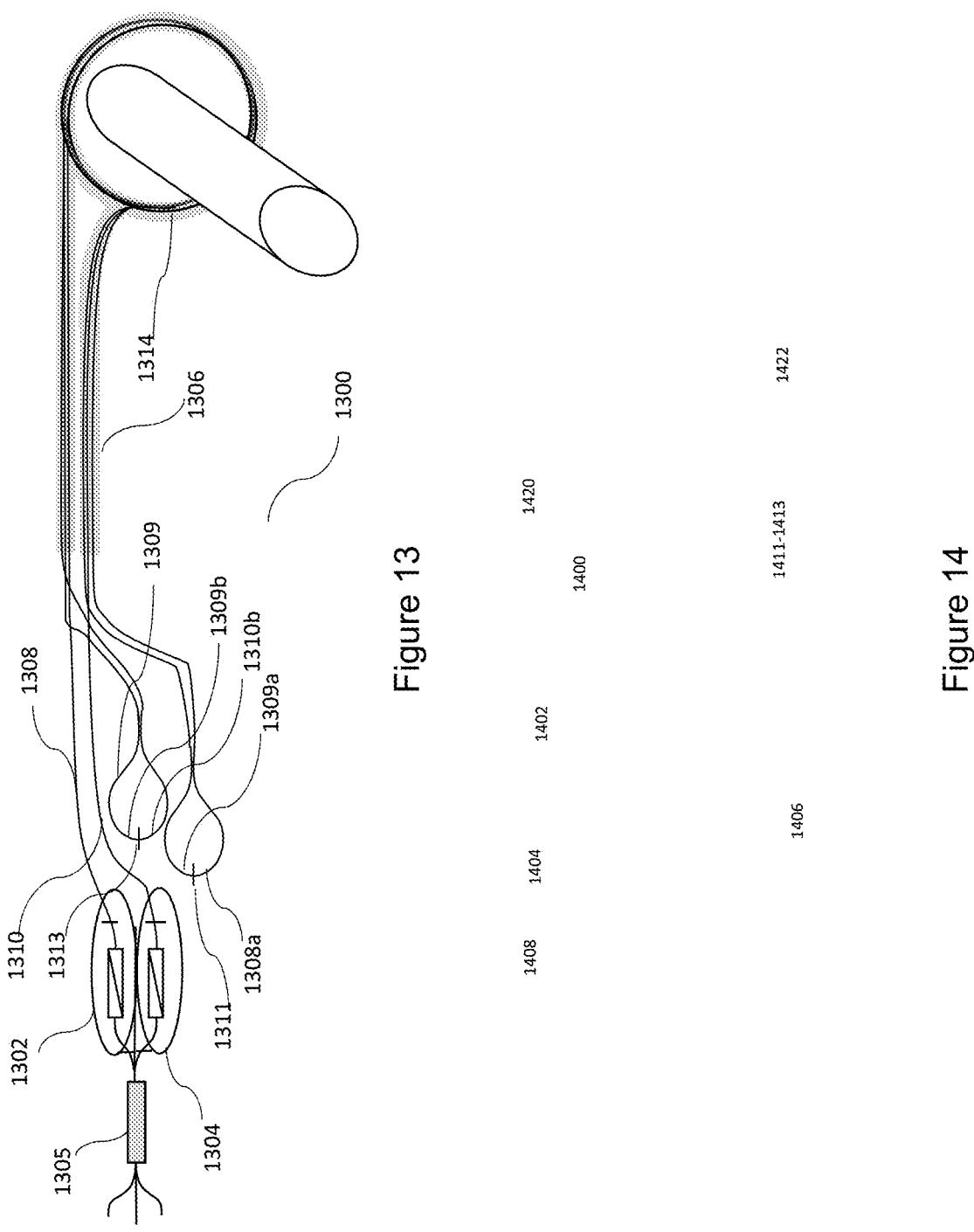
FIG. 13 is a schematic drawing illustrating a 3×3 Polarisation maintaining Sagnac current sensor featuring two circular polarisers and using a cable containing three Spun HiBi fibres to measure the enclosed current and reject rotation, according to an example embodiment.
FIG. 14 shows a schematic drawing illustrating a method and apparatus for conducting passive interferometry utilising a 3×3 optical coupler together with an optical multiplexing network.

FIG. 13 shows a schematic drawing illustrating a 3×3 Polarisation maintaining Sagnac current sensor 1300 according to an example embodiment, comprising two circular polarisers 1302, 1304 and a cable 1306 containing three Spun HiBi fibres 1308, 1309 and 1310. Compared to the example embodiment described above with reference to FIG. 6 (*a*), in this example embodiment a half wave plate 1317 is placed between the end 1308*a* of the Spun HiBi fibre 1308 and the end 1309*a* of the Spun HiBi fibre 1309, effectively swapping the handedness of the polarization mode. Similarly, another half wave plate 1319 is placed/spliced between the end 1309*b* of the Spun HiBi fibre 1309 and the end 1310*b* of the Spun HiBi fibre 1310. Placing the splices for the waveplates 1317, 1319 and the splices between the circular polarizers 1302, 1304 and the Spun HiBi fibres 1308, 13010 as close together as possible preferably ensures that the respective paths traced out by the current sensitive Spun HiBi fibres 1308, 1309 and 1310 are a good approximation to a closed loop. It is noted that in FIG. 13, the splices for the waveplates 1317, 1319 and the splices between the circular polarizers 1302, 304 and the Spun HiBi fibres 1308, 1310 are not shown placed close together, for better clarity of the drawing.

This example embodiment effectively triples the sensitivity of the loop/coil 1316 to current, while also offering excellent rejection of rotation. Furthermore, this example embodiment preferably minimizes fringe fading and offers improved stability and reduced zero current errors. More specifically, in the example embodiment a 3×3 beam coupler 1311 is constructed using HiBi fibre and the axes of the Unspun HiBi fibres of the 3×3 beam coupler 1311 are aligned with the axes of the Unspun HiBi fibre pigtails of the linear polarisers 1313, 1315 (part of the circular polarisers 1302, 1404, respectively) during the splicing to preferably achieve optimum and stable fringe contrast. This can ensure that fringe fading is minimized and consequently can ensure maximum signal to noise performance and minimum static phase error for preferably achieving a minimized DC value calculation error with reduced zero current errors.

In the above-described example embodiments, signal processing for passive interferometry can also preferably provide useful measurements without the necessity of conducting a calibration process. This can be achieved by implementing the techniques described in WO 03/002932 A1. Briefly, with reference to FIG. 14, a method and apparatus is implemented for conducting the passive interferometry utilising the 3×3 optical coupler 1400 together with an optical multiplexing network 1402, an optical input unit 1404 for inserting an optical input signal into each of the ports 1411-1413 via the optical multiplexing network 1402, and a detector unit 1406 for measuring corresponding optical outputs at each of the ports 1411-1413 via the optical multiplexing network 1402 when an optical input is inserted into one of the ports 1411-1413.

On the other side of the 3×3 coupler, a passive Sagnac interferometer 1420 and enclosed conductor 1422 are disposed. The Sagnac interferometer 1420 may be in the form of any one of the example embodiments described above.

A processing unit 1408 is configured such that products are formed, each product containing at least some of the possible $3^2$ optical outputs each, and wherein the respective products comprise the same optical multiplexing network 1402 dependent factor. In that way, the processing unit 1408 can advantageously eliminate the optical multiplexing network 1402 dependent factor based on processing the formed products to obtain substantially network independent measurements.

Also, the zero error of the interferometer (for zero current in the conductor 1422) is zero, apart from the (quadratically small) effects of small wavelength dependence of the optical multiplexing network 1402 dependent factors over the source spectrum of the optical input unit 1404.

Advantageously, the optical input unit 1404 comprises a substantially monochromatic light source.

Where the optical input unit 1404 comprises a broad light source, the optical multiplexing network 1402 preferably comprises wavelength flattened optical couplers.

The processing unit 1408 may be configured such that the eliminating of the optical multiplexing network 1402 dependent factor comprises forming independent ratios of the products.

The processing unit 1408 may be configured such that the forming of each product comprises forming the geometric mean of the factors. In another embodiment, the arithmetic means may be used.

Figure 15:
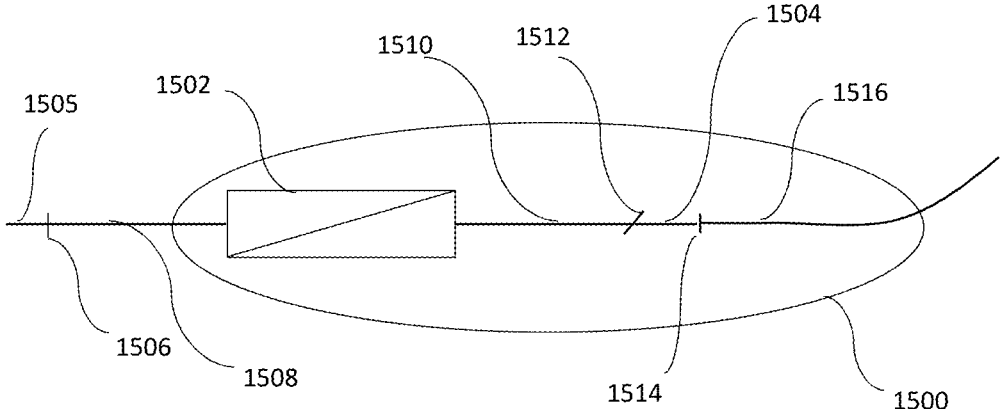
FIG. 15 shows a schematic drawing illustrating details of an example circular polariser for use in the described example embodiments.

FIG. 15 shows a schematic drawing illustrating details of an example circular polariser 1500 for use in the described example embodiments. The circular polariser 1500 comprises a combination of an at least approximately linear polariser 1502 and a ¼ beatlength section 1504 of Unspun HiBi fibre (i.e. with length ¼ beatlength). Specifically, one of the output pigtails 1505 of the fibre coupler (not shown) are spliced (indicated at numeral 1506) to the Unspun HiBi pigtail 1508 of the linear polarizer 1502. The other Unspun HiBi pigtail 1510 of the linear polarizer 1502 is spliced (indicated at numeral 1512), with the polarisation axes at the end-faces at 45 degrees, to the ¼ beatlength section 1504 of Unspun HiBi fibre, which in turn is spliced (indicated at numeral 1514) to one end 1516 of the sensing coil or cable (not shown). In the splices indicated at numerals 1506, 1514 the polarization maintaining axes at the respective end-faces are preferably aligned. In practice, as the ellipticity approaches circular then the alignment becomes less critical.

In one embodiment, a passive optical Sagnac interferometer for current sensing is provided, comprising an N×N fibre coupler, wherein N≥3; and a fibre coil disposed on a first side of the N×N fibre coupler, a first port of the N×N fibre coupler coupled to a first end of the fibre coil via a first linear polariser and a second port of the N×N fibre coupler coupled to a second end of the fibre coil via a second linear polariser; wherein the fibre coil is configured to support only one elliptical polarisation state in counter-propagating light signals in the fibre coil.

The fibre coil may be configured to support only one at least approximate circular polarisation state in the counter-propagating light signals in the fibre coil.

The fibre coil may comprise spun elliptically birefringent polarising optical fibre.

The fibre coil may comprise non-polarising spun elliptically birefringent optical fibre and the interferometer comprises first and second at least approximately circular polarisers, wherein the first circular polariser comprises the first linear polariser and a first ¼ wave fibre section is coupled between the first port of the N×N fibre coupler and the first end of the fibre coil and the second circular polariser comprises the second linear polariser and a second ¼ wave fibre section is coupled between the second port of the N×N fibre coupler and the first end of the fibre coil.

The N×N fibre coupler may comprise a N×N single mode optical fibre coupler.

The N×N fibre coupler may comprise a N×N polarisation maintaining optical fibre coupler.

The fibre coil may comprise a "figure 8" configuration.

The interferometer may comprise an optical multiplexing network disposed on a second side of the N×N fibre coupler; an optical input unit for inserting an optical input signal into each port on the second side of the N×N fibre coupler via the optical multiplexing network; a detector unit for measuring corresponding optical outputs at each of the ports on the second side of the N×N fibre coupler via the optical multiplexing network when an optical input is inserted into one of the ports on the second side of the N×N fibre coupler; and a processing unit for forming measurement products, each measurement product containing at least some of $3^2$ possible measured optical outputs, wherein the respective measurement products comprise the same optical multiplexing network dependent factor, and for eliminating the optical multiplexing network dependent factor to obtain substantially optical multiplexing network independent measurements.

In one embodiment, a passive optical Sagnac interferometer for current sensing is provided, comprising an N×N fibre coupler; a fibre cable coupled to the N×N fibre coupler, a first output port of the N×N fibre coupler coupled to a first end of a first fibre of the fibre cable and a second output port of the N×N fibre coupler coupled to a first end of a second fibre of the fibre cable; and first and second at least approximately circular polarisers, wherein the first circular polariser is coupled between the first port of the N×N fibre coupler and the first end of the first fibre and the second circular polariser is coupled between the second port of the N×N fibre coupler and the first end of the second fibre, and wherein respective second ends of the first fibre and the second fibre are coupled to each other; wherein the fibre cable is configured to be wound into a coil; and wherein the first fibre comprises non-polarising spun elliptically birefringent optical fibre and the second fibre comprises unspun highly birefringent optical fibre.

The N×N fibre coupler may comprise a N×N single mode optical fibre coupler.

The N×N fibre coupler may comprise a N×N polarisation maintaining optical fibre coupler.

The interferometer may comprise an optical multiplexing network disposed on a second side of the N×N fibre coupler; an optical input unit for inserting an optical input signal into each port on the second side of the N×N fibre coupler via the optical multiplexing network; a detector unit for measuring corresponding optical outputs at each of the ports on the second side of the N×N fibre coupler via the optical multiplexing network when an optical input is inserted into one of the ports on the second side of the N×N fibre coupler; and a processing unit for forming measurement products, each measurement product containing at least some of $3^2$ possible measured optical outputs, wherein the respective measurement products comprise the same optical multiplexing network dependent factor, and for eliminating the optical multiplexing network dependent factor to obtain substantially optical multiplexing network independent measurements.

In one embodiment, a passive optical Sagnac interferometer for current sensing is provided, comprising an N×N polarisation maintaining fibre coupler; a fibre cable coupled to the N×N fibre coupler, a first output port of the N×N fibre coupler coupled to a first end of a first fibre of the fibre cable and a second output port of the N×N fibre coupler coupled to a first end of a second fibre of the fibre cable; and first and second linear polarisers, wherein the first linear polariser is coupled between the first port of the N×N polarisation maintaining fibre coupler and the first end of the first fibre and the second linear polariser is coupled between the second port of the N×N polarisation maintaining fibre coupler and the first end of the second fibre, and wherein respective second ends of the first fibre and the second fibre are coupled to each other; wherein the fibre cable is configured to be wound into a coil; and wherein the first fibre comprises spun elliptically birefringent polarising optical fibre and the second fibre comprises unspun highly birefringent optical fibre.

The interferometer may comprise an optical multiplexing network disposed on a second side of the N×N fibre coupler; an optical input unit for inserting an optical input signal into each port on the second side of the N×N fibre coupler via the optical multiplexing network; a detector unit for measuring corresponding optical outputs at each of the ports on the second side of the N×N fibre coupler via the optical multiplexing network when an optical input is inserted into one of the ports on the second side of the N×N fibre coupler; and a processing unit for forming measurement products, each measurement product containing at least some of $3^2$ possible measured optical outputs, wherein the respective measurement products comprise the same optical multiplexing network dependent factor, and for eliminating the optical multiplexing network dependent factor to obtain substantially optical multiplexing network independent measurements.

In one embodiment, a passive optical Sagnac interferometer for current sensing is provided comprising an N×N fibre coupler; a fibre cable coupled to the N×N fibre coupler, a first output port of the N×N fibre coupler coupled to a first end of a first fibre of the fibre cable and a second output port of the N×N fibre coupler coupled to a first end of a second fibre of the fibre cable; first and second at least approximately circular polarisers, wherein the first circular polariser is coupled between the first port of the N×N fibre coupler and the first end of the first fibre and the second circular polariser is coupled between the second port of the N×N fibre coupler and the first end of the second fibre; a first half wave plate coupled between a second end of the first fibre and a first end of a third fibre of the fibre cable; and a second half wave plate coupled between a second end of the second fibre and a second end of the third fibre; wherein the fibre cable is configured to be wound into a coil; and wherein each of the first, second, and third fibres comprises non-polarising spun elliptically birefringent optical fibre.

The N×N fibre coupler may comprise a N×N single mode optical fibre coupler.

The N×N fibre coupler may comprise a N×N polarisation maintaining optical fibre coupler.

The interferometer may comprise an optical multiplexing network disposed on a second side of the N×N fibre coupler; an optical input unit for inserting an optical input signal into each port on the second side of the N×N fibre coupler via the optical multiplexing network; a detector unit for measuring corresponding optical outputs at each of the ports on the second side of the N×N fibre coupler via the optical multiplexing network when an optical input is inserted into one of the ports on the second side of the N×N fibre coupler; and a processing unit for forming measurement products, each measurement product containing at least some of $3^2$ possible measured optical outputs, wherein the respective measurement products comprise the same optical multiplexing network dependent factor, and for eliminating the optical multiplexing network dependent factor to obtain substantially optical multiplexing network independent measurements.

In the above embodiments, N may be equal to 3.

In one embodiment, a method of sensing current in a conductor using the interferometer of any one of the above embodiments is provided.

In one embodiment, a method of constructing the interferometer of any one of the above embodiments is provided.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive. Also, the invention includes any combination of features described for different embodiments, including in the summary section, even if the feature or combination of features is not explicitly specified in the claims or the detailed description of the present embodiments.

For example, while 3×3 couplers have been described in the example embodiment, N×N couplers, N>=3, may be used in different embodiments.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The invention claimed is:

1. A passive optical Sagnac interferometer for current sensing comprising:
   an N×N fibre coupler, wherein N≥3; and
   a fibre coil disposed on a first side of the N×N fibre coupler, a first port of the N×N fibre coupler coupled to a first end of the fibre coil via a first linear polariser and a second port of the N×N fibre coupler coupled to a second end of the fibre coil via a second linear polariser;

wherein the fibre coil is configured to support only one elliptical polarisation state in counter-propagating light signals in the fibre coil, such that a first light signal propagating in a first direction through the fibre coil has a same handedness as a second light signal propagating through the fibre coil in a second direction opposite to the first direction.

2. The interferometer of claim 1, wherein the fibre coil is configured to support only one at least approximate circular polarisation state in the counter-propagating light signals in the fibre coil.

3. The interferometer of claim 1, wherein the fibre coil comprises spun elliptically birefringent polarising optical fibre.

4. The interferometer of claim 1, wherein the fibre coil comprises non-polarising spun elliptically birefringent optical fibre and the interferometer comprises first and second at least approximately circular polarisers, wherein the first circular polariser comprises the first linear polariser and a first ¼ wave fibre section is coupled between the first port of the N×N fibre coupler and the first end of the fibre coil and the second circular polariser comprises the second linear polariser and a second ¼ wave fibre section is coupled between the second port of the N×N fibre coupler and the first end of the fibre coil.

5. The interferometer of claim 1, wherein the N×N fibre coupler comprises a N×N single mode optical fibre coupler.

6. The interferometer of claim 1, wherein the N×N fibre coupler comprises a N×N polarisation maintaining optical fibre coupler.

7. The interferometer of claim 1, wherein the fibre coil comprises a "figure 8" configuration.

8. The interferometer of claim 1, comprising:
   an optical multiplexing network disposed on a second side of the N×N fibre coupler;
   an optical input unit for inserting an optical input signal into each port on the second side of the N×N fibre coupler via the optical multiplexing network;
   a detector unit for measuring corresponding optical outputs at each of the ports on the second side of the N×N fibre coupler via the optical multiplexing network when an optical input is inserted into one of the ports on the second side of the N×N fibre coupler; and
   a processing unit for forming measurement products, each measurement product containing at least some of $3^2$ possible measured optical outputs, wherein the respective measurement products comprise the same optical multiplexing network dependent factor, and for eliminating the optical multiplexing network dependent factor to obtain substantially optical multiplexing network independent measurements.

9. The interferometer of claim 1, wherein N=3.

10. A method of sensing current in a conductor using the interferometer of claim 1.

11. A passive optical Sagnac interferometer for current sensing comprising:
   an N×N fibre coupler;
      a fibre cable coupled to the N×N fibre coupler, a first output port of the N×N fibre coupler coupled to a first end of a first fibre of the fibre cable and a second output port of the N×N fibre coupler coupled to a first end of a second fibre of the fibre cable; and
      first and second at least approximately circular polarisers, wherein the first circular polariser is coupled between the first port of the N×N fibre coupler and the first end of the first fibre and the second circular polariser is coupled between the second port of the NxN fibre coupler and the first end of the second fibre, and wherein respective second ends of the first fibre and the second fibre are coupled to each other;

wherein the fibre cable is configured to be wound into a coil; and wherein the first fibre comprises non-polarising spun elliptically birefringent optical fibre and the second fibre comprises unspun highly birefringent optical fibre.

12. The interferometer of claim 11, wherein the NxN fibre coupler comprises a NxN single mode optical fibre coupler.

13. The interferometer of claim 11, wherein the NxN fibre coupler comprises a NxN polarisation maintaining optical fibre coupler.

14. The interferometer of any one of claim 11, comprising:

an optical multiplexing network disposed on a second side of the NxN fibre coupler;

an optical input unit for inserting an optical input signal into each port on the second side of the NxN fibre coupler via the optical multiplexing network;

a detector unit for measuring corresponding optical outputs at each of the ports on the second side of the NxN fibre coupler via the optical multiplexing network when an optical input is inserted into one of the ports on the second side of the NxN fibre coupler; and a processing unit for forming measurement products, each measurement product containing at least some of $3^2$ possible measured optical outputs, wherein the respective measurement products comprise the same optical multiplexing network dependent factor, and for eliminating the optical multiplexing network dependent factor to obtain substantially optical multiplexing network independent measurements.

15. The interferometer of claim 11, wherein N=3.

16. A method of sensing current in a conductor using the interferometer of claim 11.

17. A passive optical Sagnac interferometer for current sensing comprising:

an NxN polarisation maintaining fibre coupler;

a fibre cable coupled to the NxN fibre coupler, a first output port of the NxN fibre coupler coupled to a first end of a first fibre of the fibre cable and a second output port of the NxN fibre coupler coupled to a first end of a second fibre of the fibre cable; and first and second linear polarisers, wherein the first linear polariser is coupled between the first port of the NxN polarisation maintaining fibre coupler and the first end of the first fibre and the second linear polariser is coupled between the second port of the NxN polarisation maintaining fibre coupler and the first end of the second fibre, and wherein respective second ends of the first fibre and the second fibre are coupled to each other;

wherein the fibre cable is configured to be wound into a coil; and wherein the first fibre comprises spun elliptically birefringent polarising optical fibre and the second fibre comprises unspun highly birefringent optical fibre.

18. The interferometer of claim 17, comprising:

an optical multiplexing network disposed on a second side of the NxN fibre coupler;

an optical input unit for inserting an optical input signal into each port on the second side of the NxN fibre coupler via the optical multiplexing network;

a detector unit for measuring corresponding optical outputs at each of the ports on the second side of the NxN fibre coupler via the optical multiplexing network when an optical input is inserted into one of the ports on the second side of the NxN fibre coupler; and a processing unit for forming measurement products, each measurement product containing at least some of $3^2$ possible measured optical outputs, wherein the respective measurement products comprise the same optical multiplexing network dependent factor, and for eliminating the optical multiplexing network dependent factor to obtain substantially optical multiplexing network independent measurements.

19. The interferometer of claim 17, wherein N=3.

20. A method of sensing current in a conductor using the interferometer of claim 17.

* * * * *